United States Patent [19]

Adams

[11] Patent Number: 4,976,612
[45] Date of Patent: Dec. 11, 1990

[54] PURGE TUBE WITH FLOATING END CAP FOR LOADING SILICON WAFERS INTO A FURNACE

[75] Inventor: Kenneth H. Adams, San Jose, Calif.

[73] Assignee: Automated Wafer Systems, San Jose, Calif.

[21] Appl. No.: 368,744

[22] Filed: Jun. 20, 1989

[51] Int. Cl.$^5$ ............................................... F27D 3/00
[52] U.S. Cl. ................................... 432/239; 432/258; 432/259; 432/253; 414/147
[58] Field of Search ...................... 432/5, 6, 253, 256, 432/258, 259; 414/147

[56] References Cited

U.S. PATENT DOCUMENTS

| | | |
|---|---|---|
| 3,744,650 | 7/1973 | Henebry et al. . |
| 4,075,972 | 2/1978 | Yamawaki et al. . |
| 4,312,294 | 1/1982 | Satoh ................................... 432/250 |
| 4,439,146 | 3/1984 | Sugita . |
| 4,459,104 | 7/1984 | Wollmann . |
| 4,490,111 | 12/1984 | Yakura . |
| 4,518,349 | 5/1985 | Tressler et al. . |
| 4,523,885 | 6/1985 | Bayne et al. . |
| 4,526,534 | 7/1985 | Wollmann . |
| 4,543,059 | 9/1985 | Whang et al. . |
| 4,613,305 | 9/1986 | Sakurai . |
| 4,651,441 | 3/1987 | Daetwyler ............................. 432/5 |
| 4,669,938 | 6/1987 | Hayward . |
| 4,767,251 | 8/1988 | Whang . |

Primary Examiner—Henry C. Yuen
Attorney, Agent, or Firm—Townsend and Townsend

[57] ABSTRACT

A purge tube for protecting a boat(s) of wafers. This purge tube does not enter the furnace. A floating end cap within the tube moves to substantially seal the furance opening during processing. The floating end cap is withdrawn back to the closed end of the tube when the wafer boat(s) is withdrawn into the tube.

16 Claims, 6 Drawing Sheets

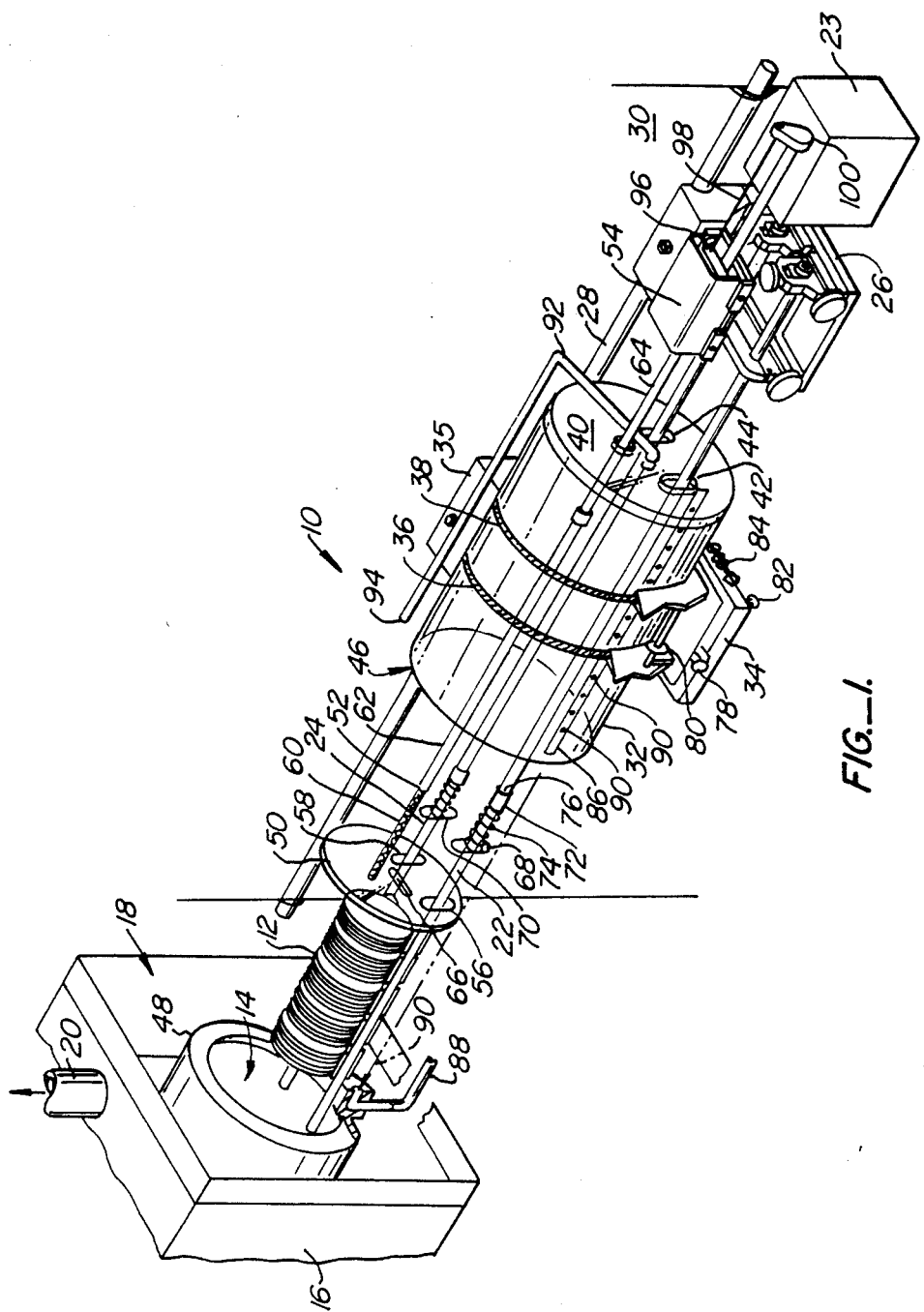
FIG._1.

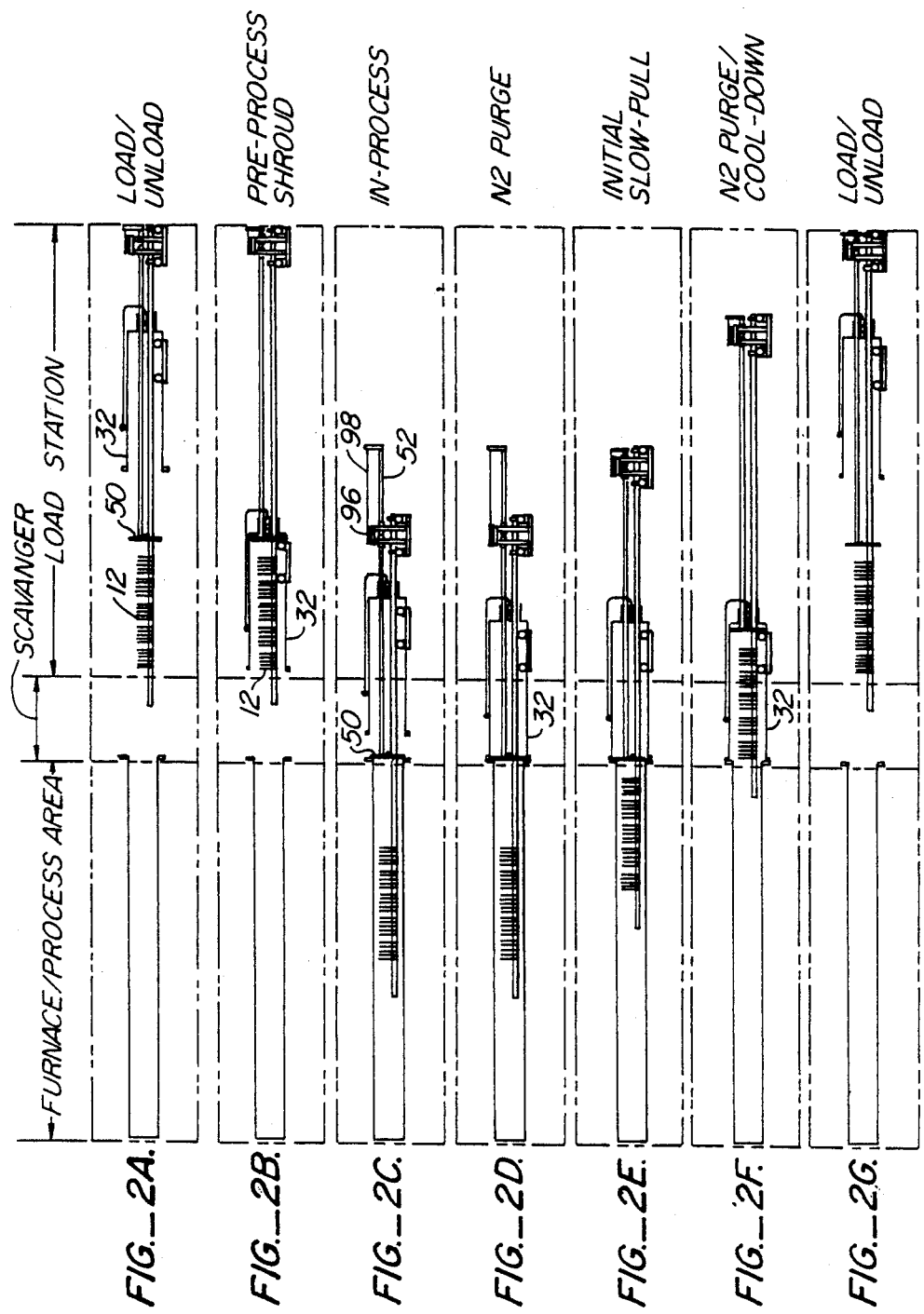

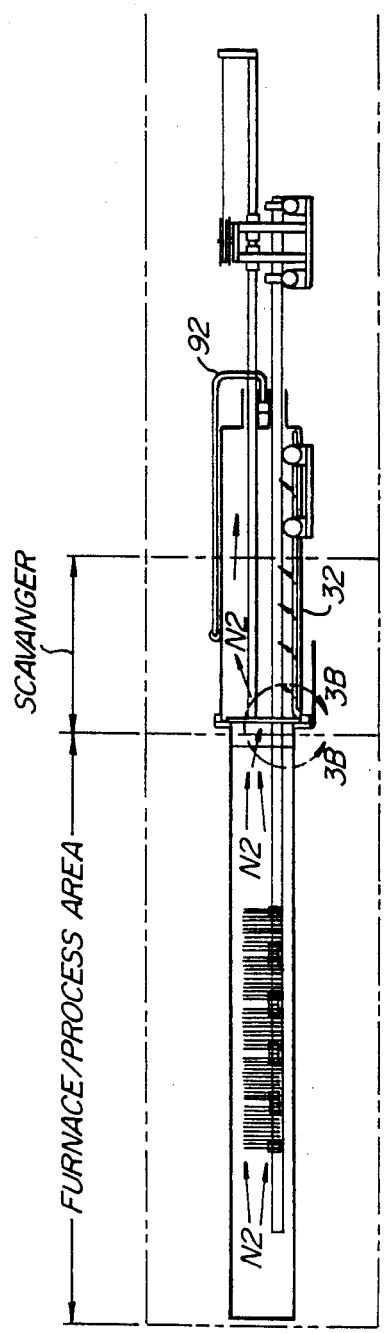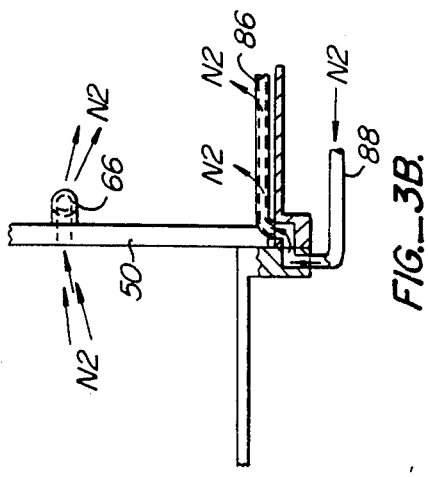
FIG._3A.
FIG._3B.

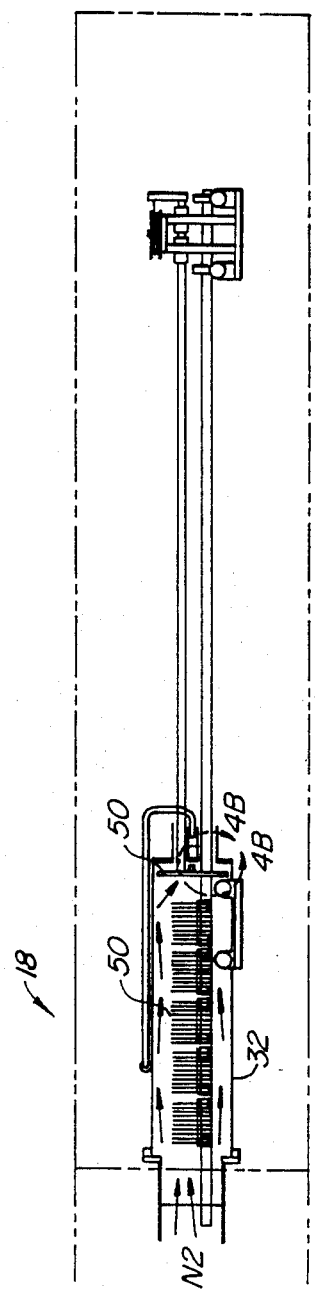
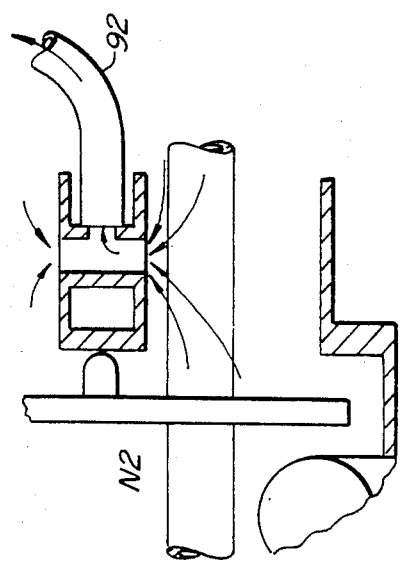
FIG._4A.
FIG._4B.

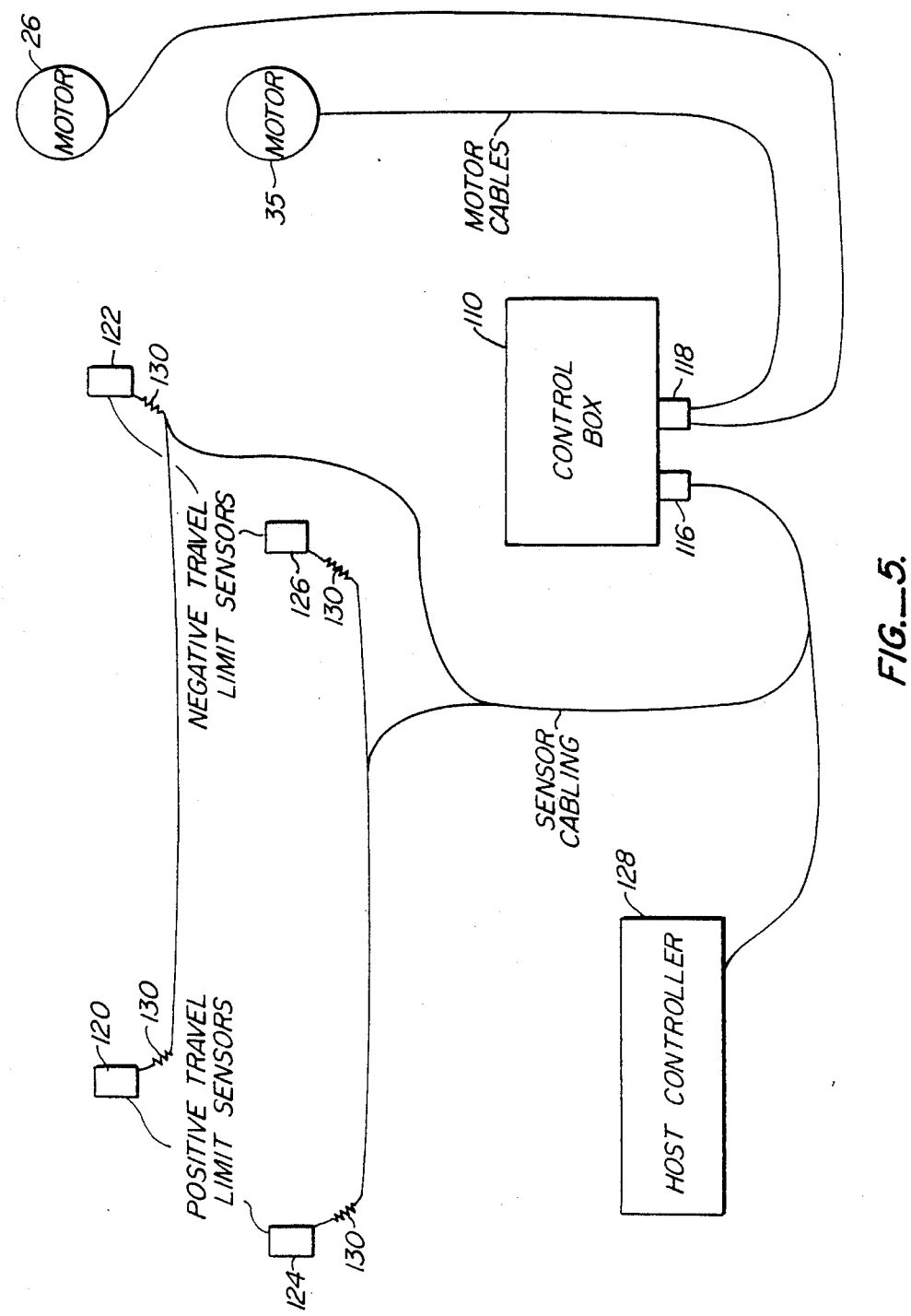
FIG._5.

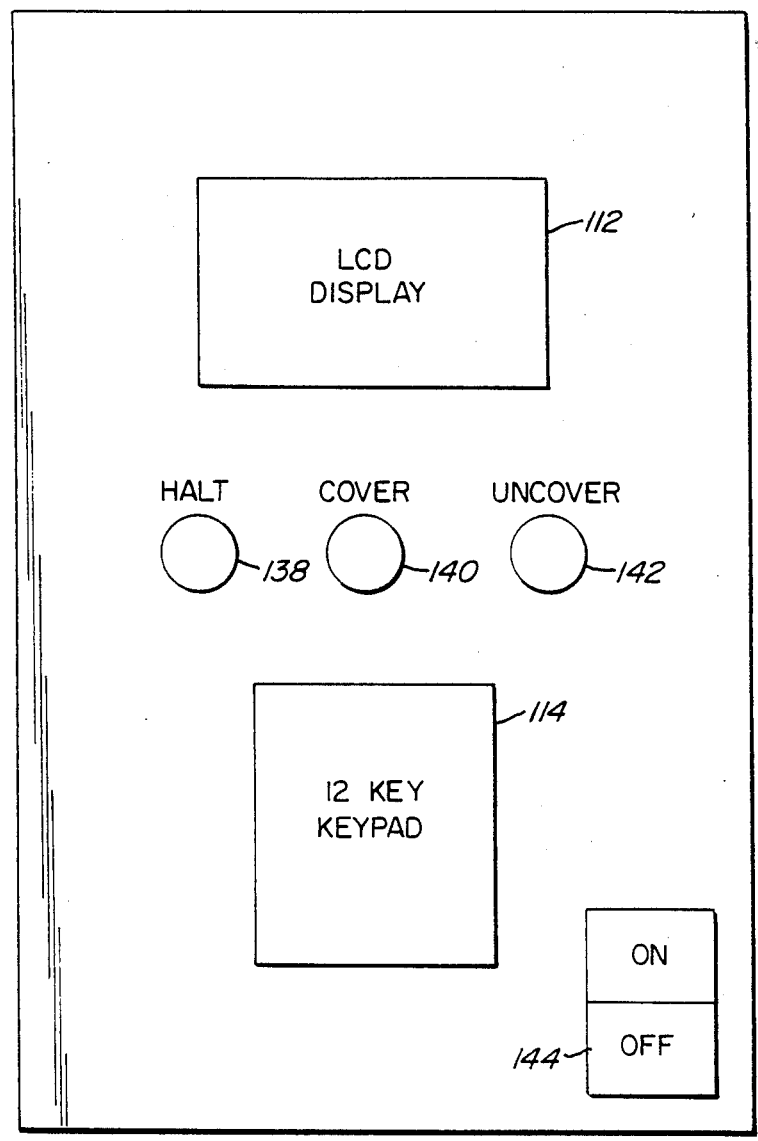
FIG._6.
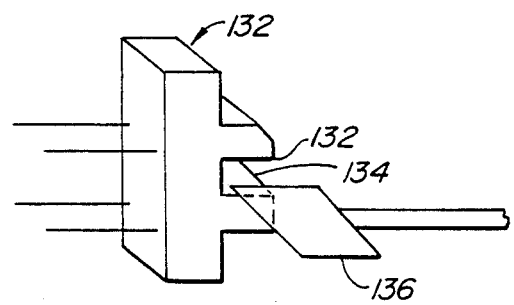
FIG._7.

1

PURGE TUBE WITH FLOATING END CAP FOR LOADING SILICON WAFERS INTO A FURNACE

BACKGROUND

The present invention relates to apparatus for loading semiconductor wafers into an oven for atmospheric pressure processing.

A variety of semiconductor processing operations are commonly performed in diffusion furnaces. Semiconductor wafers are typically subjected to high temperatures and a particular gas mixture in the furnace. A typical furnace configuration will be a stack of four tubes, each of which can receive, from an open end, a tray or "boat(s)" of disk-shaped semiconductor wafers. The closed end of the furnace tube will typically have piping coupled to it for injecting the appropriate gasses for the operation to be conducted. The opened end of the furnace tube extends into a "scavenger box" which is in an area to which a vacuum is applied to remove the reactant gasses.

In one method of loading the boat(s) of wafers into the furnace, a pair of cantilever rods or a paddle holding the boat(s) is extended into the furnace and subsequently removed with a motor driving the rods.

After the processing of the wafers, it is desirable to have a controlled cool down cycle for the wafers while exposing them to an inert gas. One method of doing this is to use a tube which encloses the wafer boat(s). This tube is extended into the furnace with the boat(s) on the cantilever rods. After processing, inert gasses are driven through the furnace and tube, and the boat(s) and tube are removed so that the tube extends outside of the furnace, but overlaps with the furnace enough to prevent outside air from entering the tube. By moving the wafer boat(s) out of the furnace, it can cool more quickly and is not limited by the cooling time of the furnace heating elements. A protective tube prevents oxygen from contacting the wafers during this cooling period. If oxygen were to contact the semiconductor wafers while they were still hot, an undesirable oxidation of the wafers would occur.

Necessarily, the tube covering the wafers must be able to withstand the high heats of the furnace and the furnace will need a large opening to accommodate the tube. In addition, the purge tube must be able to be subjected to the variety of gasses used in the furnace.

SUMMARY OF THE INVENTION

The present invention provides a purge tube for protecting a boat(s) of wafers. This purge tube does not enter the furnace. A floating end cap within the tube moves to substantially seal the furnace opening during processing. The floating end cap is withdrawn back to the closed end of the tube when the wafer boat(s) is withdrawn into the tube.

Since the purge tube of the present invention does not need to enter the furnace, it will not collect contaminating process gas on its surfaces and it will not devitrify as in the prior art. The design will not require the user to enlarge the furnace process tube. In addition, it will be cooler than a tube in the furnace, allowing the wafer boat(s) to cool faster. The result will be increased wafer die yields.

The end cap is preferably provided with oval openings around the cantilever rods to allow for the sagging of the rods or paddle due to the weight of the wafer boat(s) in the furnace. A vent at the middle of the end cap directs the exhaust gasses from the center of the furnace opening into the scavenger exhaust port. Special piping is provided at the opening of the furnace to couple to a distribution manifold at the bottom of the purge tube. When the wafer boat(s) is withdrawn into the purge tube, inert nitrogen gas can be pumped through this apparatus to provide the inert gas needed during cooling. Piping at the back end of the purge tube wraps around back to the scavenger area to provide an exhaust.

A pair of spring-loaded quartz caps are mounted on the cantilever rods so that they will compress against the oval openings of the end cap to provide the necessary sealing during furnace operation.

For a fuller understanding of the nature and advantages of the invention, reference should be made to the ensuinq detailed description taken in conjunction with the accompanying drawings.

BRIEF DESCRIPTION OF THE DRAWINGS

FIG. 1 is a perspective view of the wafer loading apparatus of the present invention;

FIGS. 2A-2G are schematic side views of the apparatus of FIG. 1 showing the positions of the various elements during loading and unloading of the semiconductor wafers;

FIGS. 3A and 3B show details of the connection of the inert gas distribution tube of FIG. 1;

FIGS. 4A and 4B are schematic drawings showing details of the operation of the exhaust piping of FIG. 1;

FIG. 5 is a block diagram of the electronic control system for the apparatus of FIG. 1;

FIG. 6 is a diagram of the front of the control panel of FIG. 5; and

FIG. 7 is a diagram of a limit sensor of FIG. 5.

DETAILED DESCRIPTION OF THE PREFERRED EMBODIMENT

FIG. 1 shows a wafer loading apparatus 10 according to the present invention. A boat(s) of wafers 12 will be loaded through an opening 14 into a furnace 16. A rectangular area 18 surrounding opening 14 of the furnace is a scavenger area for applying an exhaust vacuum. This vacuum is applied through a pipe 20.

The boat(s) of wafers 12 is supported by a pair of quartz covered cantilevered ceramic (silicon carbide) rods 22 and 24. These rods are supported by an alignment head 26 which moves along a bearing rail 28 attached to a wall or support structure 30 and is actuated by a motor drive assembly 23.

A quartz purge tube 32 is supported on a platform 34 with a pair of metal straps 36, 38. Platform 34 is coupled to a motor 23 which also moves along fixed bearing rail 28 to move the purge tube back and forth.

Purge tube 32 has a closed end 40 with openings 42 and 44 to allow the passage of cantilever rods 22 and 24. These openings are oval shaped to allow for the sag of the rods due to the weight of the wafer boat(s) at its far end. The opposite end 46 of purge tube 32 is open, and will seal against an edge 48 of the furnace tube when advanced up to the furnace opening 14.

A floating end cap 50 is coupled by a rod 52 to a platform 54 for supporting its far end. A constant force spring 96 is coupled by a wire 98 to an end 100 of end cap bar 52. The end cap 50 does not require a separate motor to move it, instead being driven through rod 52 by cable 98 from constant force spring 96. The constant force spring provides a constant force at the end cap against the opening of the furnace.

End cap 50 has a pair of openings 56 and 58 for allowing the passage of cantilever rods 22 and 24. Openings 56 and 58 are oval shaped to allow for the sag of cantilever rods 22 and 24 due to the weight of semiconductor wafer boat(s) 12.

Rod 52 has three components, a quartz portion 60, an anodized aluminum portion 62, and a hard chrome plated steel portion 64. Hard chromed steel is used because it is a very rigid material with a very hard bearing surface and aluminum is used because it has high strength to weight ratio to keep deflection at a minimum, while quartz is used because of its high thermal capacity, lack of thermal expansion, and extremely high purity, which are all factors due to its close proximity to the furnace at the connection to end cap 50.

End cap 50 also includes a vent 66 at its center. When end cap 50 is pressed against edges 48 of opening 14, exhaust gasses from the furnace will pass through vent 66 into scavenger area 18. This enhances the gas flow characteristics (maintains laminar flow) by forcing the process gasses towards the center of the process tube.

When end cap 50 is pressed against edges 48 of opening 14, its oval openings 56 and 58 are sealed by a pair of quartz caps 68 and 70. A Teflon bushing 72 fixed to bar 22 pushes cap 68 to cover opening 56 with a Teflon-coated stainless steel spring 74. A silicon O-ring 76 holds bushing 72 in place. Bushing 72 is placed so that when rod 22 advances boat(s) 12 completely into the furnace, cap 68 will be pressed up against opening 56 at the furnace opening.

To properly align purge tube 32 with opening 14, platform 34 includes a number of manually operated adjusting knobs 78, 80, 82, and 84. When purge tube 32 is abutted up against furnace 16, an internal distribution manifold 86 will connect with an injector pipe 88 at the furnace entrance as shown by arrow 90. Distribution manifold 86 has a number of openings 90 to allow nitrogen or other inert gas injected through pipe 88 to be distributed within purge tube 32.

An exhaust tube 92 is coupled to end 40 of purge tube 32. Exhaust tube 92 wraps around purge tube 32 back to an end 94 which will be within scavenger area 18 when purge tube 32 is abutted against the opening of furnace 16.

FIGS. 2A-2G shows the positions of the various elements during various operations in the processing of a boat(s) of semiconductor wafers.

As can be seen in FIG. 2A, the wafer boat(s) 12 is outside of purge tube 32, with end cap 50 in between. In this position, the wafers can be loaded and unloaded.

In FIG. 2B, purge tube 32 is moved over wafer boat(s) 12 prior to the insertion of the wafers into the furnace.

In FIG. 2C, the wafers are in the furnace in process, with end cap 50 being positioned against the opening of the furnace.

In FIG. 2D, purge tube 32 is moved up to about against the opening of the furnace in preparation for removal of the wafer boat(s). During this period, nitrogen (N2) is pumped into the furnace to purge the process gasses.

In FIG. 2E, wafer boat(s) 12 begins to be withdrawn from the furnace. In FIG. 2F, the end cap is pulled back as the wafer boat(s) is removed into tube 32. During this time, N2 is pumped into the purge tube through injector manifold 88 as shown in FIG. 1 and the wafers are allowed to cool down.

FIG. 2G shows the removal of the purge tube from over the wafers to allow unloading.

FIGS. 3A and 3B show the flow of N2 during the purging process. FIG. 3B is an enlargement of the connection of injector pipe 88 to distribution manifold 86 in purge tube 32. As can be seen from these figures, nitrogen is injected from the back of the furnace, passes over the wafers, and through vent 66 in end cap 50. At the same time, nitrogen is pumped in through injector pipe 88 to distribution manifold 86 so that cool nitrogen is passed from the bottom of the purge tube to mix with the hot nitrogen, which is passed through the furnace and vent 66. The cool nitrogen helps prevent the hot nitrogen from depositing contaminants from the process gasses and provides for a controlled temperature environment within the purge tube. The nitrogen is exhausted through exhaust pipe 92 at the end of purge tube 32.

FIGS. 4A and 4B show the flow of nitrogen out exhaust tube 92. At this point, end cap 50 has been withdrawn into purge tube 32 and boat(s) 12 has also been withdrawn into the purge tube. The nitrogen continues to be pumped at this point, and finds its way around the edges of end cap 50 and through the vent at its center into exhaust pipe 92. From there, it is routed back into scavenger area 18.

FIG. 5 shows the electrical control system for the apparatus of FIG. 1. The controls for the system are contained in a control box 110. On the front panel of the box is a display 112 and keypad 114 for operator interaction, as shown in FIG. 6. Cabling to the motors, sensors and box power comes out of connectors 116, 118 on the bottom panel. The box was designed to be side mounted, with air flow into the bottom and out of the top. The power source is 120 volts ac at 60 cycles.

The display 112 is a four line by twenty character alphanumeric liquid crystal display. It is used to display status, errors, and menu information.

The keypad 114 is a 12 key telephone style keypad. It has the digits '0' through '9' on it, as well as an asterisk ('*') and a pound sign ('#'). The keypad is used for menu selections and numeric data input.

Push button controls for halt, cover and uncover (138, 140,142) are provided, along with an ON/OFF switch 144. The keypad can be used to program in a sequence of positions for operation of the system along with the amount of time to be spent at each position during a process. The halt button will stop the system at any point. The cover and uncover buttons will cover or uncover the wafer boat(s) with the purge tube. The programming to accomplish these functions is well known to those of skill in the art.

The motors 26, 35 are 24 volt dc motors with encoders and gearheads on them. The encoder sends back positional information which is also used to calculate the current speed. The encoders are 500 line per revolution encoders which gives 2000 counts per revolution of the motor. The motor rotation is then divided down by the gear head which is a 19.2 to 1 gear ratio.

There are four photo actuated limit sensors (120, 122, 124 and 126). These limit sensors are used to detect the end of travel positions for each direction of the two axis. Therefore, there are four of these sensors. One such sensor 120 is shown in FIG. 7. The sensors have two parts: a light source (LED) 132, and a photo detector (photo-transistor) 134. The sensor runs on low power dc. There is a small ¼ watt 220 ohm resistor (130) used with each sensor that is built into the cabling adjacent to each sensor. The sensors are mounted to a frame or other support.

The four travel limit sensors must be mounted so that when the cantilever rods or shroud (purge tube) reach their maximum or minimum mechanical travel limit positions the appropriate travel limit sensor will be blocked by a metal flag 136 mounted on the moving fixture. Note that the sensor is blocked when the metal flag passes between the notched opening on the face of the photosensor.

A HOST computer 128 can be used to remotely control the operation of control box 110.

The control box 110 should be mounted in a location which is near the motorized end of the cantilever system. There must be adequate ventilation to the vents on the box. Also it should be isolated from potential chemical spills or corrosive gases.

As will be understood by those familiar with the art, the present invention may be embodied in other specific forms without departing from the spirit or a sense of characteristics thereof. For example, the end cap can be driven by other than a constant force spring, such as by using a separate motor. The end cap could be of a different shape, as could be the purge tube, and the support mechanism for the wafers could be other than cantilever tubes. Accordingly, the disclosure of the preferred embodiment of the invention is intended to be illustrative, but not limiting, of the scope of the invention which is set forth in the following claims.

We claim:

1. An apparatus for loading semiconductor wafers into a furnace, comprising:
   wafer support means for supporting a plurality of wafers and advancing said wafers into the furnace;
   purge tube means for substantially enclosing said wafers on said wafer support means, having an opening at a first end proximate said furnace and a substantially closed second end opposite said first end and being movable up to a position where said open end seals against an opening of said furnace; and
   a floating end cap, movable within said purge tube means, for substantially sealing said opening to said furnace such that said purge tube means does not need to enter said furnace to seal it during processing of said wafers to seal said opening, said floating end cap being independently retractable to a position within said purge tube means proximate said second end to allow withdrawal of said wafer support means to within said purge tube means.

2. The apparatus of claim 1 wherein said purge tube is cylindrical in shape and said floating end cap is disk-shaped.

3. The apparatus of claim 1 further comprising a first motor coupled to said wafer support means for advancing said wafer support means into said furnace and a second motor for moving said purge tube means independent of said wafer support means.

4. THe apparatus of claim 3 further comprising a rod coupled to said floating end cap at a first end and constant force spring coupled between a second end of said rod and said wafer support means.

5. The apparatus of claim 1 wherein said wafer support means comprises a pair of cantilever rods and said floating end cap includes a pair of oval shaped openings for permitting passage of said rods through said end cap.

6. The apparatus of claim 5 wherein said end cap is disk-shaped and further comprises a vent proximate its middle.

7. The apparatus of claim 5 further comprising quartz plates mounted on said rods having sufficient size to cover said oval openings in said end cap.

8. The apparatus of claim 7 further comprising first and second springs coupled to said first and second quartz plates, respectively, and first and second bushings coupling said springs to said rods.

9. The apparatus of claim 1 further comprising an exhaust tube coupled to said second end of said purge tube for directing exhaust gasses back towards a first end of said purge tube outside of said purge tube.

10. The apparatus of claim 1 further comprising a pipe mounted internally near the bottom of said purge tube means for receiving, at a first end proximate said first end of said purge tube, an inert gas and distributing said inert gas into said purge tube.

11. The apparatus of claim 1 further comprising a purge tube means platform for supporting said purge tube means and moving said purge tube means along a fixed rail, said purge tube platform including means for adjusting a position of said purge tube means relative to said rail to align said purge tube means with an opening of said furnace.

12. An apparatus for loading semiconductor wafers into a furnace, comprising:
   wafer support means for supporting a plurality of wafers and advancing said wafers into the furnace;
   purge tube means for substantially enclosing said wafers on said wafer support means, having an opening at a first end proximate said furnace and a substantially closed second end opposite said first end and being movable up to a position where said open end seals against an opening of said furnace;
   a floating end cap, movable within said purge tube means, for substantially sealing said opening to said furnace;
   a first motor coupled to said wafer support means for advancing said wafer support means into said furnace and a second motor for moving said purge tube means independent of said wafer support means;
   a rod coupled to said floating end cap at a first end;
   a constant force spring coupled between a second end of said rod and said wafer support means; and
   wherein said rod coupled to said end cap has a quartz portion proximate said end cap, a hard chrome plated steel portion proximate said second end of said rod and an aluminum portion between said quartz and hard chrome plated steel portions.

13. An apparatus for loading a plurality of semiconductor wafers into a furnace on a pair of cantilever rods, comprising:
   a cylindrical purge tube having a first, closed end with two openings for passage of said rods and a second, open end;
   a purge tube platform for supporting said purge tube and moving said purge tube along a fixed rail;
   an end cap, having a pair of openings for passage of said rods, being mounted between said purge tube and said semiconductor wafers to move within said purge tube and through said second, open end of said purge tube;

a motor coupled to said cantilever rods for moving said rods and said wafers into and out of said furnace by movement along said rail;

a rod for driving said end cap having a first end coupled to said end cap;

a constant force spring for driving said rod mounted between a second end of said rod and said cantilever rods;

a pair of quartz plates resiliently mounted at a fixed position to said rods for covering said openings in said end cap;

a distribution manifold mounted inside said purge tube near a bottom thereof for distributing an inert gas therein; and an exhaust tube having a first end coupled to said closed end of said purge tube and a second end proximate said open end of said purge tube.

14. The apparatus of claim 13 further comprising a structure for aligning said rods coupled between said cantilever rods and said constant force 15. An apparatus for loading semiconductor wafers into a furnace, comprising:

wafer support means for supporting a plurality of wafers and advancing said wafers into the furnace;

purge tube means for substantially enclosing said wafers on said wafer support means, having an opening at a first end proximate said furnace and a substantially closed second end opposite said first end and being movable up to a position where said open end seals against an opening of said furnace;

a floating end cap, movable within said purge tube means, for substantially sealing said opening to said furnace; and a rod coupled to said floating end cap at a first end and a constant force spring coupled between a second end of said rod and said wafer support means.

16. An apparatus for loading semiconductor wafers into a furnace, comprising:

wafer support means for supporting a plurality of wafers and advancing said wafers into the furnace;

purge tube means for substantially enclosing said wafers on said wafer support means, having an opening at a first end proximate said furnace and a substantially closed second end opposite said first end and being movable up to a position where said open end seals against an opening of said furnace; and a pipe mounted internally near the bottom of said purge tube means for receiving, at a first end proximate said first end of said purge tube, an inert gas and distributing said inert gas into said purge tube.

* * * * *